United States Patent
Kathavate et al.

(10) Patent No.: US 6,496,790 B1
(45) Date of Patent: Dec. 17, 2002

(54) MANAGEMENT OF SENSORS IN COMPUTER SYSTEMS

(75) Inventors: Srinivas K. Kathavate, Olympia, WA (US); David R. Richardson, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 176 days.

(21) Appl. No.: 09/672,952

(22) Filed: Sep. 29, 2000

(51) Int. Cl.[7] ............................................... G06F 11/22
(52) U.S. Cl. ....................................... 702/188; 714/816
(58) Field of Search ............................. 702/188, 57–59, 702/81, 110, 116, 119, 183–186; 324/500, 512, 527, 528, 531; 709/400; 710/48, 49; 714/1–3, 4, 10, 14, 21, 22, 25, 811, 816

(56) References Cited

U.S. PATENT DOCUMENTS 3,784,977 A * 1/1974 Carter et al. ................ 714/816
5,450,340 A * 9/1995 Nicolaidis .................... 708/531
6,418,550 B1 * 7/2002 Heinrich ...................... 714/712

* cited by examiner

*Primary Examiner*—Marc S. Hoff
*Assistant Examiner*—Edward Raymond
(74) *Attorney, Agent, or Firm*—Antonelli, Terry, Stout & Kraus, LLP

(57) ABSTRACT

A method processes the outputs of a discrete sensor in a computer system. An initial value mask is applied to each one of the offset bits in the output of the discrete sensor. An initial value is obtained for each one of the offset bits in the output of the discrete sensor according to the initial value mask. It is next determined whether or not the offset bits in the output of the discrete sensor includes both initialization offset bits and transition offset bits. If the offset bits include both initialization offset bits and transition bits, only the initialization bits of an incoming mask corresponding to the output of the discrete sensor are reset.

20 Claims, 5 Drawing Sheets

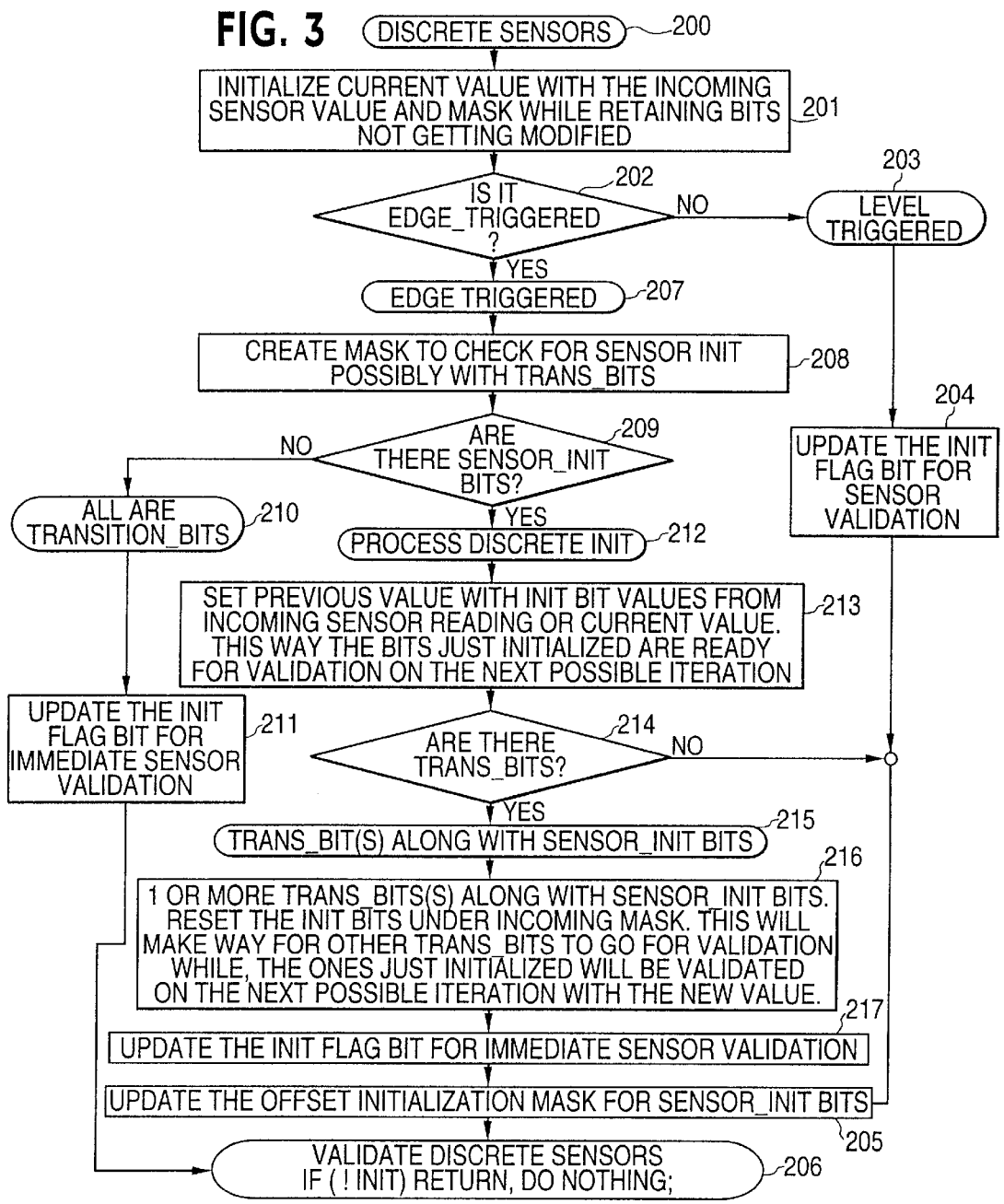

FIG. 4

| # | Description | Case1 | Case2 | Case3 |
|---|---|---|---|---|
| ITERATION #1 | Previous Value | 0000 | 0100 | 1111 |
| | Initial Value Mask | 0000 | 0110 | 1111 |
| | Current Value | 0000 | 0000 | 0000 |
| | Sensor Reading | 0001 | 1010 | 0000 |
| | Incoming Mask | 0001 | 1011 | 1111 |
| | Current Value | 0001 | 1110 | 0000 |
| | Uninitialized Value Mask | 1111 | 1001 | 0000 |
| | Previous Value | 0001 | 1100 | NC 1111 |
| | Incoming Mask | 0001 | 0010 | NC 1111 |
| | Initial Value Mask | 0001 | 1111 | NC 1111 |
| | INIT Flag | 0 | 1 | 1 |
| | Validation | NO | YES | YES |
| | Previous Value | 0001 | 1110 ($B_1$ ⓥ) | 0000 ($B_{0123}$ ⓐ) |

FIG. 5

| # | Description | Case1 | Case2 | Case3 |
|---|---|---|---|---|
| ITERATION #2 | Sensor Reading | 1010 | 0000 | 0011 |
| | Incoming Mask | 1011 | 1101 | 0011 |
| | Current Value | 1010 | 0010 | 0011 |
| | Uninitialized Value Mask | 1110 | 0000 | 0000 |
| | Previous Value | 1011 | NC 1110 | NC 0000 |
| | Incoming Mask | 0001 | NC 1101 | NC 0011 |
| | Initial Value Mask | 1011 | NC 1111 | NC 1111 |
| | INIT Flag | 1 | 1 | 1 |
| | Validation | YES | YES | YES |
| | Previous Value | 1010 ($B_0$ ⓥ) | 0010 ($B_{23}$ ⓥ) | 0011 ($B_{01}$ ⓐ) |
| ⓐ -Assertion Event   ⓥ -Deassertion Event and NC-No Change | | | | |

FIG. 6

```
typedef struct SsnsrDef
{
    UINT8   u8snsrNumber;     // sensor Number
    UINT8   u8sensorCount;    // # of Sensors in this group
    UINT8   u8flags;          // see Table 2-1
    UINT8   u8sensorType;     // Sensor Type see table 2-2
    UINT8   u8eventType;
    UINT8   u8internalType;
    union
    {
      UINT16  u16initValue;   // The Initial value for Discrete offsets
      UINT16  u16prevValue;   // The Previous value for Discrete offsets
    }U1;
    union
    {
      UINT16  u16initValMask; //Indicates the mask for Initial value.
      UINT16  u16readableAndSettableMsk;
    }U2;
    UINT8           (SnsrCallback *)(UINT8, UINT8, SSnsrEvInfo_t *);
} SSnsrDef_t;
```

MANAGEMENT OF SENSORS IN COMPUTER SYSTEMS

BACKGROUND

1. Field of the Invention

This invention relates generally to computer systems. In particular, the present invention relates to methods of managing the discrete sensors in server computer systems.

2. Description of the Related Art

Many computer systems, such as servers, include system management having various management features. The system management is responsive to various sensors. These sensors may detect, for example, the absence/presence and the operation/failure of a power supply. The sensors may include "threshold sensors" which provide analog values such as voltage or temperature and "discrete sensors" which are sensors of a digital type returning one or two bytes of data, each one of the bits in the data having a value changing between 0 and 1 to identify a sensor status or event occurrence. For example, there might be a plurality of processor status discrete sensors which return bits in response to a query of the sensor indicative of several different characteristics of the corresponding processor. For example, one of the returned bits could indicate whether or not the processor is present, another bit could indicate whether or not there's been a thermal trip in the processor, another bit could indicate whether or not the processor slot is occupied by a terminator, and another bit could indicate whether or not there has been a booting error.

The data signals can be queried by system management or sent automatically by the sensor, for example, upon the occurrence of some specified event. Unfortunately, the algorithms in current system managements process the offsets at sensor level as a whole, instead of individual discrete offset level. This makes it difficult to handle the offsets efficiently and to easily adapt when changes are made to the hardware platform, and corresponding discrete sensors, in a computer system.

BRIEF DESCRIPTION OF THE DRAWINGS

A better understanding and appreciation of the foregoing and of the attendant advantages of the present invention will become apparent from the following detailed description of example embodiments of the invention in conjunction with the accompanying drawings. While the foregoing and following written and illustrated disclosure focuses on disclosing example embodiments of the invention, it should be clearly understood that the same is by way of illustration and example only and the invention is not limited thereto.

The following represents brief descriptions of the drawings, wherein:

FIG. 3 is a flowchart of an example algorithm processing the outputs of a discrete sensor according to an embodiment of the invention.

FIG. 4 provides case examples of sensor readings in a first iteration through the flowchart of FIG. 2.

FIG. 5 provides case examples of sensor readings in a second and subsequent iterations through the flowchart of FIG. 2.

FIG. 6 shows an exemplary data structure for sensor defaults in an embodiment of the invention.

DETAILED DESCRIPTION

This application describes various computer systems as an example of a device in accordance with the invention. Generally, these example embodiments involve an Intel Architecture (IA) platform server computer system with an Intel Pentium® processor unit and Intel chipset. (A server computer system is a system configured, by hardware and/or software, to provide a high degree of performance in communications with other computer systems over a communications network.) These example embodiments may utilize a special purpose ASIC (application specific integrated circuit) to provide system management features. However, the invention is not limited in its implementation to the example embodiments described in this application or to any other kind of computer system. This application also describes example processes for the bit wise handling of discrete sensor outputs. These example methods may be used in the example computer systems described in this application or in any other computer system having suitable system management. In any case, the invention is characterized only by the claims as they may ultimately be amended and is not limited by any of the examples described in detail in this specification.

Figure 1:
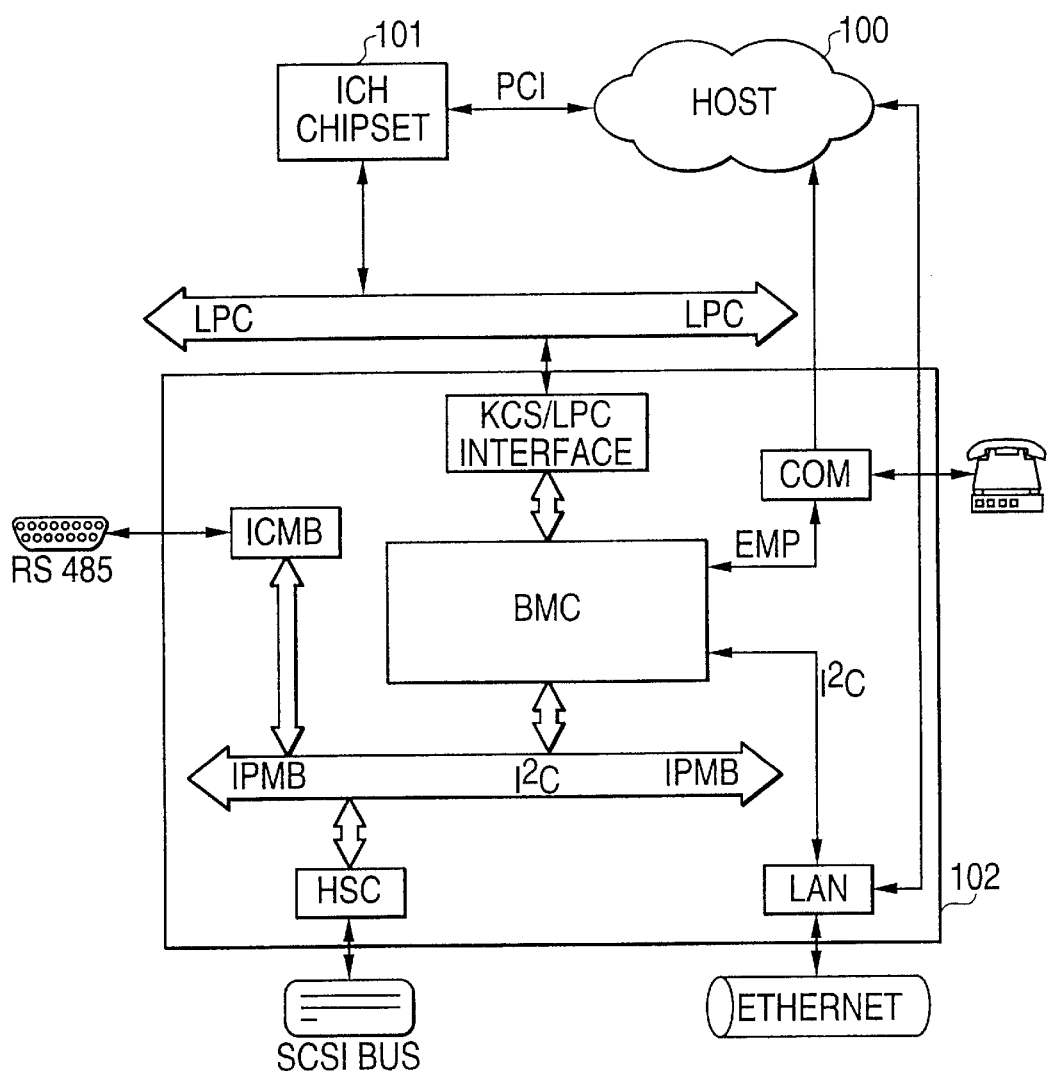
FIG. 1 is a block diagram of an example system management architecture in a server computer system.

For the sake of simplicity, discussions will concentrate mainly on an IA server computer system, an example of the general architecture of which is shown in the block diagram of FIG. 1 even though the scope of the present invention is not limited thereto. The system includes one or more host processor(s) 100, an Input/Output Controller Hub (ICH) chipset 101 for managing memory control and input/output functions (connected to host processor(s) 100 through a PCI bus as shown in FIG. 1 or through some other bus) and operating system software (not shown) running on host processor(s) 101. A system management baseboard 102 connects to ICH chipset 101 through a keyboard controller style (KCS) interface/low pin count (LPC) bus. The baseboard 102 may be a printed circuit board configured to be added or removed to the computer system after manufacture and assembly such as by, for example, expansion card slots.

The system management functions performed by system management baseboard 102 are primarily controlled by a baseboard management controller (BMC) 104. BMC 104 controls communications between the system management baseboard 102 and host processor(s) 100 (and the operating system and other software running on host processor(s) 100). Other interfaces, such as the Local Area Network (LAN), modem/terminal interface on the emergency management port (EMP), and the system SCSI, interact with the BMC through the corresponding interface modules shown in FIG. 1. BMC 104 is platform specific and provides a hardware/software interface so that a plurality of system management software routines may be written according to software interface and carried out on a plurality of different platforms. As an example, BMC 104 can support the Intelligent Platform Management Interface (IPMI) specification, Version 1.0, Revision 1.1, published Nov. 15, 1999 by Intel, Hewlett-Packard, NEC, and Dell Computer Corporation, and the system management software routines may be IPMI compliant. BMC 104 communicates with the internal modules using its private $I^2C$ bus or the IPMB bus. Host processor(s) 100 interact with BMC 104, IPMB/$I^2C$ interface with BMC 104, and EMP interface to communicate with the internal modules using a private $I^2C$ bus or the IPMB bus.

Figure 2:
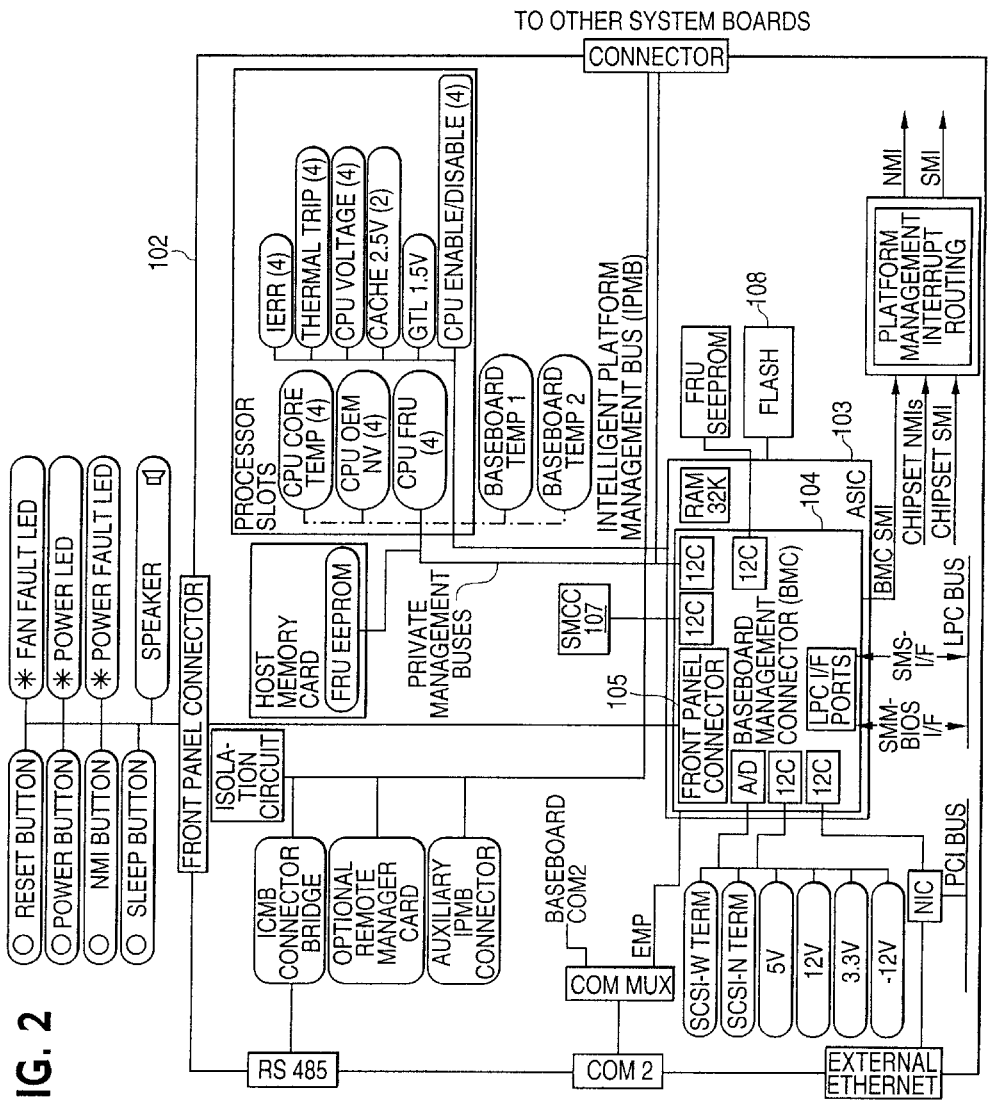
FIG. 2 is a block diagram of the baseboard in the example system management architecture in FIG. 1.

FIG. 2 shows an example of system management baseboard 102, including an application specific integrated circuit (ASIC) 103 to implement the server management functions. (Of course, ASIC 103 is not necessary and the hardware implementing the system management may alternatively consist of several different chips.) ASIC 103 includes a micro-controller silicon core, which includes the functionality of BMC 104 as well as the functionality of a front panel controller (FPC) 105 to control a front panel and user inputs, and possibly a power supply controller. A RISC processor (not shown) controls various server management functions, such as the system power/reset control, sensor monitoring, system initialization, fault resilient booting (FRB), etc. Although not shown in FIG. 2, ASIC 103 also contains a General Purpose Input/Output (GPIO) interface for programmable pins, Universal Adaptive Receiver/Transmitters (UARTs) to connect to other devices.

The front panel controller 105 for BMC 104 has conventional user controls for power, reset, NMI, and optional Sleep Button operations, in addition to indicators for working conditions and faults. A liquid crystal display (LCD) panel (16×2 character size, for example) provides textual status display as part of the user interface.

BMC connects to and controls these elements as well as sufficient random access memory (RAM), such as 32K shown in FIG. 2, is used for data and occasional flash programming. The field replacement unit system electrically erasable programmable read-only memory (FRU SEEPROM) is used for inventory information and possibly an event filter table.

ASIC 103 includes multiple I²C (Inter-Integrated Circuit) bus controllers for connection to an Intelligent Platform Management Bus (IPMB) based on a multimaster, 2-wire, serial I²C bus that interconnects baseboard 102 and chassis electronics and provides a communications path for system platform management information between management controller BMC 104 and other elements. One of the I²C bus controllers interfaces BMC 104 with various sensors. Some, but not all, of the sensors are shown in FIG. 2. Baseboard 102 includes sensor monitoring and control circuitry 107 for receiving sensor data and driving control signals to the various sensors. Non-volatile flash memory 108 is used to store sensor data records (SDRs), initial values and initial value masks associated with each one of the sensors, BMC operation code, firmware update code, system event log (SEL) and possibly BMC persistent data.

Although the ASIC is utilized in the example embodiment shown in FIG. 2, the present invention is applicable for use with computer systems of all types of architecture, including any system which includes hardware for system management. For example, the system management need not be performed by a special purpose ASIC. It may be performed by a plurality of separate integrated chips. Conversely, the computer system may be a large computer system containing a plurality of processors, storage units, etc., such as a server complex. Such a large computer system may have a plurality of system management controllers, either combined or on separate units. ASIC 103 may optionally include the functionality of an Intelligent Chassis Management Bridge (ICMB) controller for managing chassis-to-chassis bus interconnections (i.e., for connecting together the management systems of a plurality of computers in a server system) or a hot swap controller (HSC). Of course, a wide variety of implementations, arrangements and configurations may be used with the invention.

The major aspect of the invention involves a unique algorithm for processing the discrete sensors of server computer system 100 at bit level. In this case, 'Discrete Sensors' refers to a sensor of digital type with each offset identifying a sensor status and with its value changing between 0 and 1. Each one of the discrete sensors needs to have a corresponding Initial Value available for all of its supported offsets. As an example, for a sensor providing a single byte data reading, there may be up to eight offsets and up to eight corresponding initial values. As another example, for a sensor whose data reading consists of two bytes, there may be one reserved bit, fifteen offsets and fifteen initial values corresponding. The most significant bit may be reserved for future expansion. Of course, the number of bytes and the number of reserved bits in a data reading may vary. Furthermore, although a number of offsets may be possible, only a subset of the offsets may actually be used and supported in a system management process.

There are two different types of offsets: 1) storage initialization offsets where the initial value is obtained from non-volatile storage; and 2) sensor initialization offsets where the initial value is obtained from the sensor itself. An internal Initial Value Mask stored in non-volatile storage 108 identifies, with associated corresponding bits of 1's and 0's, which offsets are storage initialization type, and obtain their initial value from non-volatile storage, and which offsets are sensor initialization type, and obtain their initial value from the sensor itself.

Discrete sensors with offsets of storage initialization type 1) in which the Initial Value comes from non-volatile storage 108 instead of the sensor itself, as identified by the internal Initial Value Mask, will be initialized from a default Initial Value. Static sensor data, containing the default Initial Value, for such sensors are initially hard coded and stored in a defaults table of non-volatile storage 108 at manufacturing time or soon thereafter with an system management initialization utility. An exemplary data structure for the defaults table is provided in FIG. 5. The Initial Value has an alias as Previous Value and is used as Previous Value later in the processing described below.

For edge triggered discrete sensors with offsets of sensor initialization type 2) in which the Initial Value comes from the sensor itself, as identified by the internal Initial Value Mask, the initial value is not obtained from storage as described above. Instead, the first physical sensor value is treated as the initial value, and the subsequent sensor reading values are compared against the previous value for edge transition detection. As indicated above, the internal Initial Value mask is used to identify the initialization type of, and thus the initialization method used for, every supported offset in each discrete sensor.

The initial values of offsets for a discrete sensor need not be all high (1) or all low (0). For example, a power supply discrete sensor can have two offsets describing the condition of a power supply. The initial value of one offset can start off as "1" in the case of a power supply absence/presence bit and the initial value of another offset can be "0" as in the case such of power supply operation/failure bit. The initial value for one of the two offsets can indicate the presence of the power supply where the presence of the power supply is initially defined from non-volatile storage 108 as being "1". The initial value for the other one of the two offsets can indicate the failure of the power supply where the failure of the power supply is initially defined from non-volatile storage 108 as being "0". If the first sensor value offset of the incoming sensor reading is "1" for presence and the second sensor value offset is "0" for failure, it should be considered as being normal. Therefore, no alarm/warning should be generated. On the other hand, if the first value offset is "1"

for presence and the second value offset is "1" for failure, then an alarm/warning of failure is generated for the event.

Each time baseboard 102 is powered on or reset, a system initialization routine uses the Initial Value Mask to initialize the value for each offset using the appropriate corresponding initialization method and also builds a sensor table in RAM by copying necessary start up data for the sensor table array structure from non-volatile storage 108 from code space constant defaults. An initialization agent loads the sensor table with the SDR records. The Initialization agent is a SDR firmware utility to read the SDR records in non-volatile storage 108 and parse through each one of the records to initialize the SDR values in the sensor table. Parsing is performed after the sensor table and scanning tables are created and made ready to accept the SDR update IPMI commands from the initialization agent. These commands may include sending IPMI messages to the micro controller core of an ASIC or to external micro controllers.

After initialization, the sensor table is always maintained with a current subset of SDR information. The sensor table interface routine is platform independent while the sensor definition constants are platform specific. The SDR records in non-volatile storage 108 can be deleted, or new records can be added, by sending IPMI conforming commands to BMC 104. However, in some systems, deleting an existing SDR record from non-volatile storage 108 may cause the system management software to re-initialize/ reset, thereby rebuilding the sensor table in RAM. Also, when adding a new SDR record to non-volatile storage 108, it may only be necessary to re-run the initialization agent to rebuild the sensor table without the system being subject to reset.

During operation of computer system 100, the system management on baseboard 102 needs to repeatedly identify incoming sensor reading offsets for discrete sensors, compare them against the initial values the first time, compare them with the most immediate previous value subsequent times and process the results of the comparisons accordingly. This is somewhat complicated for bit level processing of offsets in sensor readings from sensor initialization type discrete sensors, because the sensor readings can bring either the initial value from the physical sensor, a transition value from the physical sensor, or a combination of both initial values and transition values from the physical sensor. Proper management must be carried out to avoid having the first sensor reading value from a sensor initialization type discrete sensor treated as a transition value rather than an initial value.

The flow chart in FIG. 2 illustrates the logical method by which these possible scenarios are identified and processed according to an example method embodiment of the invention. The logical method in the flow chart of FIG. 2 is preferably carried out by an Application Program Interface (API) routine called from the sensor scanning routine as well as from other internal modules of BMC 104. Exemplary code for carrying out the processing described herein is attached as an appendix to this application. This API routine is also responsible for validating the sensor data. Although the details of the validation process are not described in detail herein, it involves comparing the actual sensor readings to the expected sensor readings and making system management decisions based on the comparison.

A sensor scanning routine scans the discrete sensors (step 200) on a periodic basis using sensor monitoring and control circuitry (SMCC) 107. Noise is removed from the incoming real-time sensor readings in sensor monitoring and control circuitry 107, such as by performing a logical AND operation with an incoming mask. The incoming mask indicates the bits of the sensor reading which are getting either SET (1) or RESET (0). A logical AND operation is performed between the current sensor value stored in the sensor table and the complement of the incoming mask to retain the bits that are not getting modified. The result of the logical AND operation is used as an input in a logical OR operation with the incoming sensor reading to update the value currently stored in the sensor table in RAM. (Step 201).

At this point, a decision is made (step 202) to identify the discrete offsets as being either an edge triggered type or a level triggered type. In the branch for level triggered type discrete offsets (203), an INIT flag bit for sensor validation is updated and set (step 204) and the offset initialization mask for initial sensor bits is updated (step 205) before the offsets go through the bit validation, identifying the change in levels to be one of a Level-High or a Level-Low type (206). The outcome of such bit validation may result in an event message being generated and stored in a system event log (SEL) in non-volatile storage 108. Such an event message may be sent to the SEL firmware to log an event through BMC 104, and if necessary, an appropriate alarm/warning can be prepared by the system management software.

The edge-triggered offsets (207) are computed with an initial value before they are subjected to bit validation for identifying transition and generating a warning/event. Data from the sensor table indicates the number of offsets corresponding to the discrete sensor which are active (the sensors are identified by unique respective numbers included in the preferred data structure of the SDR record stored in non-volatile storage 108) and an "initialized bit mask" is created to check for initialized bits and transition bits (Step 208). The initialized bit mask is checked to identify the uninitialized bits for the sensor and extract the offset bits of interest.

A determination is made of whether any first time initialization bits can be identified in the incoming sensor data reading (step 209). If not, then it is concluded that the sensor data reading has only transition bits (210). The INIT flag bit is updated and set (step 211) so the sensor data reading can be immediately validated. The incoming mask is passed on for bit level validation (step 206) of all incoming bits of the sensor data reading with respect to the incoming mask.

If first time initialization bits are identified in step 209, they are processed as indicated by steps 213–218 in FIG. 2. In this procedure, the API routine may need to handle both initialization and transition bits together in the same sensor data reading. The first time initialization bits are computed and replace the corresponding previous value in the sensor table (step 213) so that the initialized bits are ready for validation when the process next executes validation step 206.

Next, a determination is made of whether or not there are one or more transition bits along with the initialization bits (step 214). If there are one or more transition bits along with the initialization bits (215), the incoming sensor data reading mask bits of the first time initialization bits are reset (step 216). This enables other transition bits to go for bit validation and for the new offset values of the initialization bits to be validated when the process next executes validation step 206. Also, the INIT flag bit is set to enable immediate validation of the sensor data reading (step 217). If there are no transition bits, steps 216 and 217 are skipped. Since the INIT flag bit is not set, the validation routine in step 206 will be aborted as soon as it starts. Regardless of whether or not there are one or more transition bits along with the initialization bits, the initialized value mask is modified to set the bit value for the newly initialized offset values (step 218).

The table in FIG. 3 illustrates the first processing (iteration) of three different example incoming sensor data readings with the initial value mask according to the method illustrated in FIG. 2. Each one of the examples has a discrete size of 4. All of the bits of the data sensor reading in case 1 are sensor initialization type bits. Case 2 is an example of a data sensor reading having a combination of storage initialization type bits and sensor initialization type bits. All of the bits of the data sensor reading in case 3 are storage initialization type bits. The description field of each row in FIG. 3 identifies the processing variables used in corresponding steps of the flow chart in FIG. 2. Some of these description fields are shown more than once to show their contents as they get modified in the control flow.

The table in FIG. 4 illustrates processing (iteration) of the three subsequent hypothetical incoming sensor data readings of the cases shown in FIG. 3 according to the method illustrated in FIG. 2. Therefore, the first row ("Sensor Reading") contains new data corresponding to the subsequent hypothetical sensor data readings while the other rows, such as Initialized Value Mask and Previous Value, have values carried over from FIG. 3.

The example method embodiment of handling discrete sensor data readings described above has several advantages over previously known methods. It supports bit level initialization of the discrete offsets. This provides the advantage of being able to support and process all combinations of bit configurations dictated by the discrete sensors in the original hardware platform of the computer system, or subsequent modifications of the hardware platform with a single piece of system management software, thereby accelerating the time to market value of server products. It also handles the offsets independent of each other with initial values and an initial value mask which add value to configure the offsets mutually exclusively. Furthermore, the information is made available at the same time that the offset values are processed independently of each other.

Other features and advantages of the invention may be apparent to those skilled in the art from the detailed description of the example embodiments and claims when read in connection with the accompanying drawings. While the foregoing and following written and illustrated disclosure focuses on disclosing example embodiments of the invention, it should be understood that the same is by way of illustration and example only, is not to be taken by way of limitation and may be modified in learned practice of the invention. While the foregoing has described what are considered to be example embodiments of the invention, it is understood that various modifications may be made therein and that the invention may be implemented in various forms and embodiments, and that it may be applied in numerous applications, only some of which have been described herein. It is intended by the following claims to claim all such modifications and variations.

What is claimed is:

1. A method of processing the outputs of a discrete sensor in a computer system, said method comprising:
    applying an initial value mask to each one of a plurality of offset bits in the output of a discrete sensor;
    obtaining an initial value for each one of the plurality of offset bits in the output of the discrete sensor according to the initial value mask;
    determining whether or not the plurality of offset bits in the output of the discrete sensor includes both initialization offset bits and transition offset bits; and
    if the plurality of offset bits includes both initialization offset bits and transition bits, resetting only the initialization bits of an incoming mask corresponding to the output of the discrete sensor.

2. The method recited in claim 1, wherein a bit mask is created to determine whether or not the plurality of offset bits in the output of the discrete sensor includes both initialization offset bits and transition offset bits.

3. The method recited in claim 1, wherein the initial value for at least one of the offset bits of the discrete sensor is obtained from storage and the initial value for at least one other offset bit of the discrete sensor is obtained from the sensor itself.

4. The method recited in claim 3, wherein the initial value mask identifies the offset bits for which the initial value is obtained from storage and the offset bits for which the initial value is obtained from the sensor itself.

5. The method recited in claim 4, wherein the offset bits are processed independently of each other.

6. The method recited in claim 5, wherein the initialized value mask obtained when processing an output of the discrete sensor is used when processing the subsequent output of the discrete sensor.

7. A software program stored in a tangible medium, the computer program, when executed, causing a computer system to carry out a method of processing the outputs of a discrete sensor in the computer system, the method comprising:
    applying an initial value mask to each one of a plurality of offset bits in the output of a discrete sensor;
    obtaining an initial value for each one of the plurality of offset bits in the output of the discrete sensor according to the initial value mask;
    determining whether or not the plurality of offset bits in the output of the discrete sensor includes both initialization offset bits and transition offset bits; and
    if the plurality of offset bits includes both initialization offset bits and transition bits, resetting only the initialization bits according to an incoming mask.

8. The method recited in claim 7, wherein a bit mask is created to determine whether or not the plurality of offset bits in the output of the discrete sensor includes both initialization offset bits and transition offset bits.

9. The method recited in claim 7, wherein the initial value for at least one of the offset bits of the discrete sensor is obtained from storage and the initial value for at least one other offset bit of the discrete sensor is obtained from the sensor itself.

10. The method recited in claim 9, wherein the initial value mask identifies the offset bits for which the initial value is obtained from storage and the offset bits for which the initial value is obtained from the sensor itself.

11. The method recited in claim 10, wherein the offset bits are processed independently of each other.

12. The method recited in claim 11, wherein the initialized value mask obtained when processing an output of the discrete sensor is used when processing the subsequent output of the discrete sensor.

13. A computer system comprising:
    at least one processor unit;
    a plurality of discrete sensors; and
    a management system, connected to said at least one processor unit and said plurality of discrete sensors, and adapted to manage the computer system, said management system including software to:
        apply an initial value mask to each one of a plurality of offset bits in the output of a discrete sensor;

obtain an initial value for each one of the plurality of offset bits in the output of the discrete sensor according to the initial value mask;

determine whether or not the plurality of offset bits in the output of the discrete sensor includes both initialization offset bits and transition offset bits; and if the plurality of offset bits includes both initialization offset bits and transition bits, reset only the initialization bits according to an incoming mask.

14. The computer system recited in claim 13, wherein the management system includes non-volatile storage for storing the initial value of at least some of the offset bits.

15. The computer system recited in claim 14, wherein the management system includes a sensor monitoring and control circuitry adapted to monitor the discrete sensors and receive the outputs of the discrete sensors.

16. The computer system recited in claim 15, wherein the management system includes a micro controller adapted to control the non-volatile storage and the sensor monitoring and control circuitry and to provide a programming interface to execute said software in said management system.

17. The computer system recited in claim 16, wherein said programming interface comprises the Intelligent Platform Management Interface (IPMI).

18. The computer system recited in claim 17, wherein the micro-controller is included as part of a special purpose ASIC.

19. The computer system recited in claim 13, wherein the computer system is a server computer system.

20. The computer system recited in claim 19, wherein the sensor detects the characteristics of a processor in the processing unit.

* * * * *